(12) United States Patent
Chen et al.

(10) Patent No.: US 11,742,464 B2
(45) Date of Patent: Aug. 29, 2023

(54) LIGHT-EMITTING DEVICES AND METHODS FOR MANUFACTURING THE SAME

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 99 days.

(21) Appl. No.: 17/386,915

(22) Filed: Jul. 28, 2021

(65) Prior Publication Data

US 2021/0359176 A1    Nov. 18, 2021

Related U.S. Application Data

(62) Division of application No. 16/377,415, filed on Apr. 8, 2019, now Pat. No. 11,088,306.

(51) Int. Cl.
*H01L 33/58*  (2010.01)
*H01L 33/00*  (2010.01)
(Continued)

(52) U.S. Cl.
CPC .......... *H01L 33/58* (2013.01); *H01L 25/0753* (2013.01); *H01L 27/156* (2013.01); *H01L 31/14* (2013.01); *H01L 31/16* (2013.01); *H01L 33/005* (2013.01); *H01L 33/0012* (2013.01); *H01L 33/0093* (2020.05); *H01L 33/44* (2013.01); *H01L 33/48* (2013.01); *H01L 33/62* (2013.01)

(58) Field of Classification Search
CPC .............................. H01L 33/58; H01L 33/005
USPC ......................................................... 362/235
See application file for complete search history.

(56) References Cited

U.S. PATENT DOCUMENTS

2015/0021634 A1*  1/2015  Ishihara ............ G02F 1/133611
                                                                257/88
2015/0362165 A1* 12/2015  Chu ........................ H01L 33/32
                                                                362/235
(Continued)

FOREIGN PATENT DOCUMENTS

CN             107507845 A      12/2017

OTHER PUBLICATIONS

CN Office Action dated Jan. 20, 2023 in Chinese application No. 202010161313.0.

*Primary Examiner* — Christopher M Raabe
(74) *Attorney, Agent, or Firm* — McClure, Qualey & Rodack, LLP

(57) ABSTRACT

A light-emitting device is provided. The light-emitting device includes a first substrate. The light-emitting device also includes a second substrate including a light-shielding structure. The light-emitting device further includes a first light-emitting module and a second light-emitting module being adjacent to each other. The first light-emitting module and the second light-emitting module are disposed between the first substrate and the second substrate. The first light-emitting module and the second light-emitting module are spaced apart by a gap, and the light-shielding structure at least partially covers the gap in a top view direction of the light-emitting device.

6 Claims, 16 Drawing Sheets

(51) Int. Cl.
*H01L 25/075* (2006.01)
*H01L 27/15* (2006.01)
*H01L 31/14* (2006.01)
*H01L 31/16* (2006.01)
*H01L 33/44* (2010.01)
*H01L 33/48* (2010.01)
*H01L 33/62* (2010.01)

(56) References Cited

U.S. PATENT DOCUMENTS

2016/0351539 A1* 12/2016 Bower .................... H01L 33/44
2018/0076182 A1*  3/2018 Wu ...................... H01L 25/0753
2019/0302350 A1* 10/2019 Yamaoka ................ H01L 33/60
2020/0105980 A1*  4/2020 Sim ....................... H01L 27/153
2020/0185453 A1*  6/2020 Cho ........................ H01L 33/44

* cited by examiner

LIGHT-EMITTING DEVICES AND METHODS FOR MANUFACTURING THE SAME

CROSS REFERENCE TO RELATED APPLICATIONS

This application is a Division of U.S. patent application Ser. No. 16/377,415, filed Apr. 8, 2019 and entitled "LIGHT-EMITTING DEVICES AND METHODS FOR MANUFACTURING THE SAME", now U.S. Pat. No. 11,088,306, the entirety of which is incorporated by reference herein.

BACKGROUND

Technical Field

The present disclosure relates to a light-emitting device, and in particular to a light-emitting device that includes a plurality of light-emitting modules.

Description of the Related Art

Light-emitting devices are widely used. The performance and/or quality of these light-emitting devices need to be continually improved. Therefore, a new light-emitting device with improved performance and/or quality is needed.

SUMMARY

In accordance with some embodiments of the present disclosure, a method for manufacturing a light-emitting device. The method includes providing a first substrate. The method also includes transferring a first light-emitting module with a plurality of first light-emitting units and a second light-emitting module with a plurality of second light-emitting units to the first substrate. The method further includes providing a light-shielding structure on the first substrate. There is a gap between the first light-emitting module and the second light-emitting module, and the light-shielding structure is overlapped with the gap.

A detailed description is given in the following embodiments with reference to the accompanying drawings.

BRIEF DESCRIPTION OF THE DRAWINGS

The disclosure may be understood by reading the subsequent detailed description and examples with references made to the accompanying drawings, wherein.

DETAILED DESCRIPTION

Figure 1A:
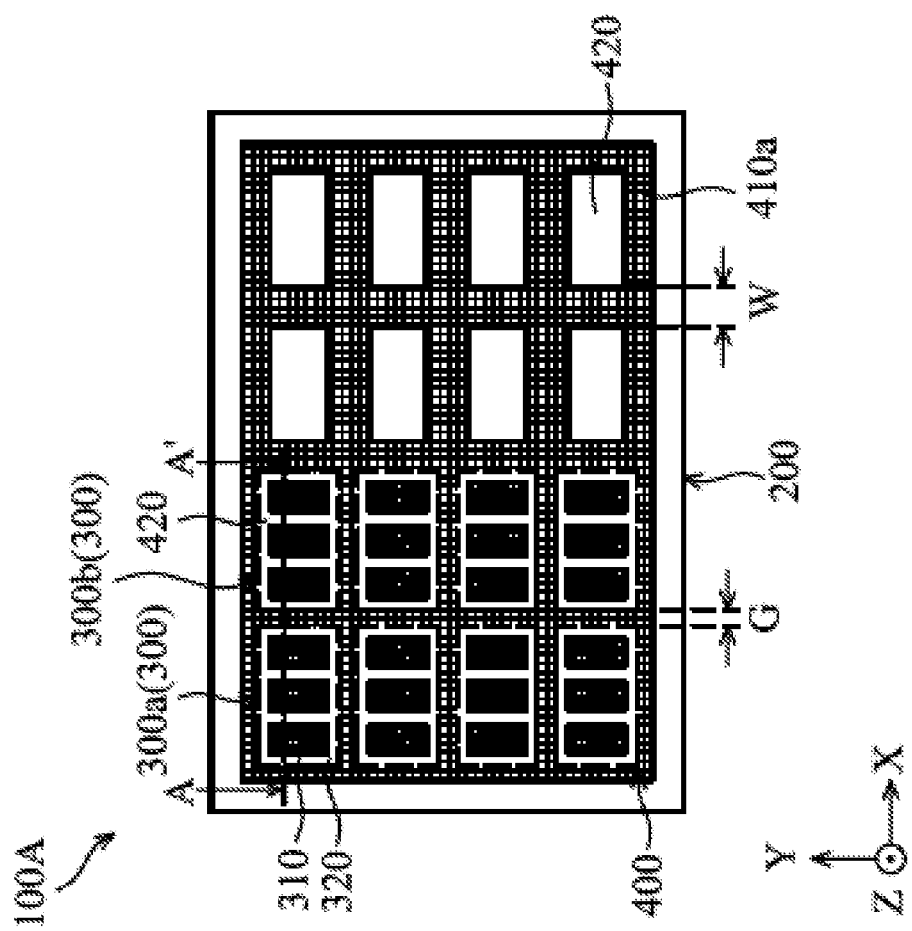
FIGS. 1A-1D illustrate top views of a light-emitting device and its elements in accordance with some embodiments of the present disclosure.
Figure 1B:
Figure 1D:
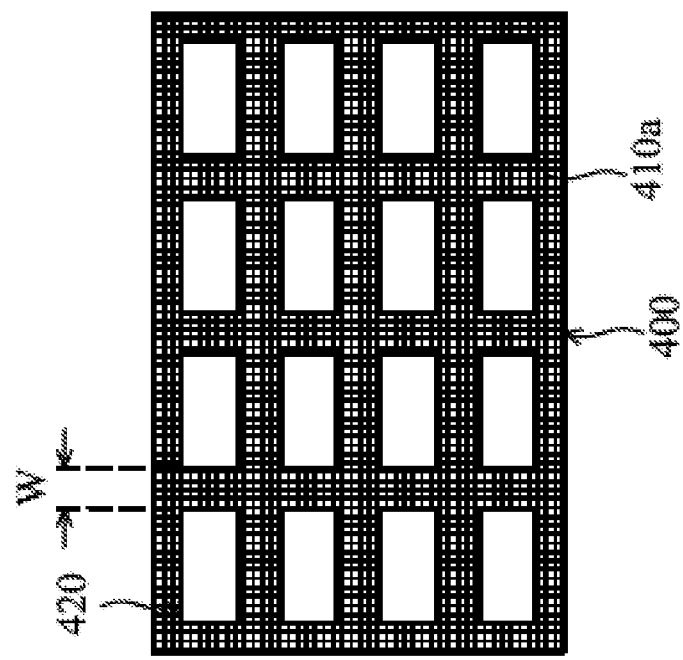
Figure 1C:
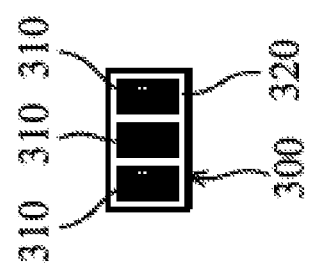

The light-emitting device of the present disclosure and the manufacturing method thereof are described in detail in the following description. In the following detailed description, for purposes of explanation, numerous specific details and embodiments are set forth in order to provide a thorough understanding of the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements. However, the use of like and/or corresponding numerals in the drawings of different embodiments does not suggest any correlation between different embodiments. In addition, in this specification, expressions such as "first material layer disposed above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing. In the drawings, some components may be omitted for clarity. Moreover, some components in the drawings may be eliminated as another embodiment of the present disclosure.

The terms "about", "substantially", "equal", or "same" generally mean within 20% of a given value or range, or mean within 10%, 5%, 3%, 2%, 1%, or 0.5% of a given value or range.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, "connected" and "interconnected," refer to a relationship wherein structures are secured or attached to one another either directly or indirectly through intervening structures, as well as both movable or rigid attachments or relationships, unless expressly described otherwise.

In addition, the phrase "in a range from a first value to a second value" indicates the range includes the first value, the second value, and other values in between.

In addition, the term "cover" includes the meaning of "cover partially", or "cover completely". The term "overlap with" includes the meaning of "overlap partially" or "overlap completely".

Refer to FIGS. 1A-1D, which illustrate top views of a light-emitting device 100A and its elements in accordance with some embodiments of the present disclosure. It should be appreciated that some elements are omitted in FIGS. 1A-1D for brevity. The light-emitting device 100A may include a first substrate 200, a light-emitting module 300 and a second substrate 400, which are individually illustrated in FIGS. 1B, 1C and 1D. The first substrate 200 or the second substrate 400 may include a rigid substrate (such as a glass substrate or a quartz substrate) or a flexible substrate (such as a plastic substrate), but not limited thereto. The material of the plastic substrate may include polyimide (PI), polycarbonate (PC) or polyethylene terephthalate (PET), but not limited thereto.

In some embodiments (refer to FIGS. 1A-1D and 2), the light-emitting module 300 may be disposed between the first substrate 200 and the second substrate 400. In some embodiments (refer to FIGS. 1A-1D and 2), the light-emitting module 300 may include a plurality of light-emitting units 310 and a fixing layer 320. In some embodiments, the light-emitting units 310 may be fixed through the fixing layer 320. In some embodiments, the light-emitting units 310 may be connected to each other through the fixing layer 320. It is appreciated that the number of the light-emitting unit 310 of the light-emitting module 300 is merely an exemplary, and the scope of the elements in the disclosure is not limited. In some embodiments, the plurality of light-emitting units 310 and the fixing layer 320 may be disposed on a growth substrate (not shown), and the plurality of light-emitting units 310 and the fixing layer 320 may be transferred from the growth substrate to a carrier substrate (not shown). In some embodiments, the light-emitting units 310 and the fixing layer 320 are removed from the growth substrate (not shown), the fixing layer 320 is cut to form a plurality of light-emitting modules 300. As a result, each light-emitting module 300 may include multiple light-emitting units 310 that are connected by the fixing layer 320. In some embodiments, the material of the fixing layer 320 may include a molding compound, such as epoxy resin, silicon wafer, sapphire, glass, PI, other suitable materials or combinations thereof, but it is not limited. In some embodiments, the fixing layer 320 may include a single layer or a multi-layer, but it is not limited.

In some embodiments (refer to FIGS. 1A-1D and 2), the second substrate 400 may include a light-shielding structure 410a, but it is not limited. In some embodiments, the light-shielding structure 410a may include black photoresist, black printing ink, black resin, organic resin, glass paste, other suitable material or combinations thereof, but it is not limited. In some embodiments, the light-shielding structure 410a may have a mesh shaped, but it is not limited. The light-shielding structure 410a may include a plurality of openings 420. In some embodiments, the opening 420 may correspond to the light-emitting module 300 As shown in FIG. 1A, in top view direction (a normal direction Z of the first substrate 200) of the light-emitting device, the light-emitting modules 300 overlaps with the openings 420 of the light-shielding structure 410a. It should be appreciated that in order to clearly illustrate the position relation of the light-emitting module 300 and the light-shielding structure 410a, the light-emitting modules 300 may be disposed on the left side of the light-emitting device 100A are illustrated. Actually, one of the openings 420 may overlap with one of the light-emitting modules (such as the light-emitting module 300 or the light-emitting unit 310) in the normal direction Z of the first substrate 200, but it is not limited.

Figure 2:
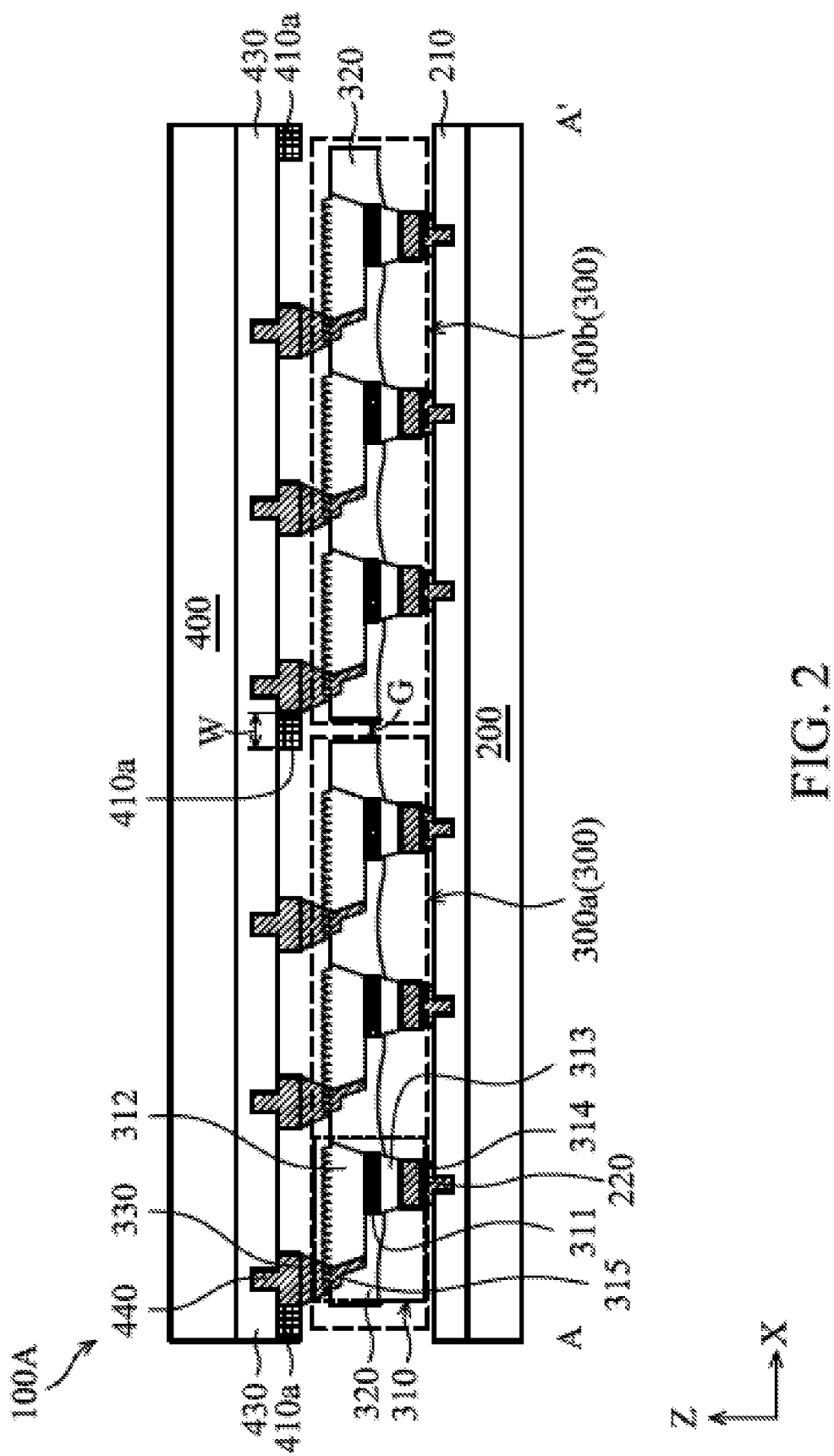
FIG. 2 illustrates a cross-sectional view of the light-emitting device along the line A-A' of FIG. 1A in accordance with some embodiments of the present disclosure.

Refer to FIG. 2, which illustrates a cross-sectional view of the light-emitting device 100A along the line A-A' of FIG. 1A in accordance with some embodiments of the present disclosure. As shown in FIG. 2, the light-emitting module 300a and the light-emitting module 300b are disposed between the first substrate 200 and the second substrate 400, but it is not limited. The first substrate 200 may include a first circuit layer 210. The first circuit layer 210 may include dielectric layers and conductive wires disposed therein. The active elements or the passive elements (not shown) may be disposed in the first circuit layer 210. The active elements may include thin film transistor (TFT) or another suitable element, but it is not limited. The first substrate 200 may include a plurality of pads 220 electrically connected to the first circuit layer 210.

The second substrate 400 may include a second circuit layer 430. The second circuit layer 430 may include dielectric layers and conductive wires disposed therein. The active elements or passive elements (not shown) may be disposed in the second circuit layer 430. The second substrate 400 may include a plurality of pads 440 electrically connected to the second circuit layer 430. The material of the pad 220 and/or the pad 440 may include copper (Cu), aluminum (Al), molybdenum (Mo), tungsten (W), gold (Au), chromium (Cr), nickel (Ni), platinum (Pt), titanium (Ti) or other suitable materials or combinations thereof, but it is not limited. In some embodiments (refer to FIG. 2), the light-shielding structure 410a may be disposed between the second circuit layer 430 and first substrate 200, but it is not limited. In some embodiments (not shown), the light-shielding structure 410a may be disposed between the second circuit layer 430 and the second substrate 400. In some embodiments (not shown), the light-shielding structure 410a may be disposed between the light-emitting module 300a (and/or the light-emitting module 300b) and the first substrate 200. In some embodiments (not shown), the light-shielding structure 410a may be disposed between the light-emitting module 300a (and/or the light-emitting module 300b) and the first circuit layer 210.

The light-emitting unit 310 may include a light-emitting diode (LED), a micro light-emitting diode (μLED), a mini light-emitting diode (mini-LED), quantum dot LED (QD-LED), or other suitable materials, but it is not limited.

As shown in FIG. 2, the light-emitting unit 310 may include a light-emitting layer 311, semiconductor layers 312 and 313, electrodes 314 and 315, and one of the electrodes 314 and 315 is p-type electrode, another one of the electrodes 314 and 315 is n-type electrode. The light-emitting unit 310 may be electrically connected to the first circuit layer 210 through the pad 220. The light-emitting unit 310 may be electrically connected to the second circuit layer 430 through the pad 440. In some embodiments, the material of the pad 220 and the pad 440 may be the same or different. In some embodiments (FIG. 2), the light-emitting device 100A may include an auxiliary electrode 330. In some embodiments, the auxiliary electrode 330 may be electrically connected to the light-emitting unit 310. In some embodiments, the auxiliary electrode 330 may be electrically connected to a common electrode (not shown), but it is not limited. In some embodiments, the auxiliary electrode 330 may be electrically connected to the pad 440. In some embodiments, the common electrode (not shown) may be disposed on the second substrate 400 (or the first substrate 200). In some embodiments, the common electrode (not shown) may be disposed in the second circuit layer 430 (or first circuit layer 210). The material of the auxiliary electrode 330 may include copper (Cu), aluminum (Al), titanium (Ti), silver (Ag), gold (Au), tin (Sn), lead (Pb), other suitable materials or combinations thereof, but it is not limited.

In some embodiments (FIG. 2), the fixing layer 320 may be adjacent to the light-emitting units 310. In some embodiments, there is a gap G between two adjacent light-emitting modules 300, such as the light-emitting modules 300a and 300b. A width of gap G may be defined by using a scanning electron microscope (SEM) image to measure a minimum space between the fixing layers 320 of two adjacent light-emitting modules 300 in a cross-sectional view (refer FIG. 2). The cross-sectional image may be along any direction perpendicular with the normal direction Z. In some embodiments, the width of gap G may be defined by using an OM image to measure a minimum space between the fixing layers 320 of two adjacent ones of the light-emitting modules 300 in any direction perpendicular with the normal direction Z (refer FIG. 1A). In some embodiments (FIG. 2), in the normal direction Z of the first substrate 200, the light-shielding structure 410a may overlap with the gap G. In some embodiments (FIG. 2), the light-shielding structure 410a may cover the gap G in the normal direction Z. In some embodiments (FIG. 2), in a cross-sectional view, a width W of the light-shielding structure 410a in any direction perpendicular with the normal direction Z (such as direction X or direction Y) may be greater than or equal to a width of the gap G in the same direction. In some embodiments, a width of the gap G may be greater than 0 and less or equal to 5 mm (0 mm<the width of the gap G≤5 mm). The width W of the light-shielding structure 410a may defined by a minimum width of the light-shielding structure 410a. The gap G may be used as a space for expansion of the light-emitting unit 310 or reducing collision, but it is not limited. In some embodiments (FIG. 2), the light-shielding structure 410a may overlap with a portion of the fixing layer 320 in the normal direction Z.

In this disclosure, the light-emitting module 300 may include the light-emitting unit 310 and the fixing layer 320. More specifically, the light-emitting modules 300 may be defined by the fixing layer 320. For example, the fixing layers 320 of the light-emitting module 300a and the light-emitting module 300b are separated from each other, so the light-emitting module 300a and the light-emitting module 300b could be defined as two different light-emitting modules.

Figure 3A:
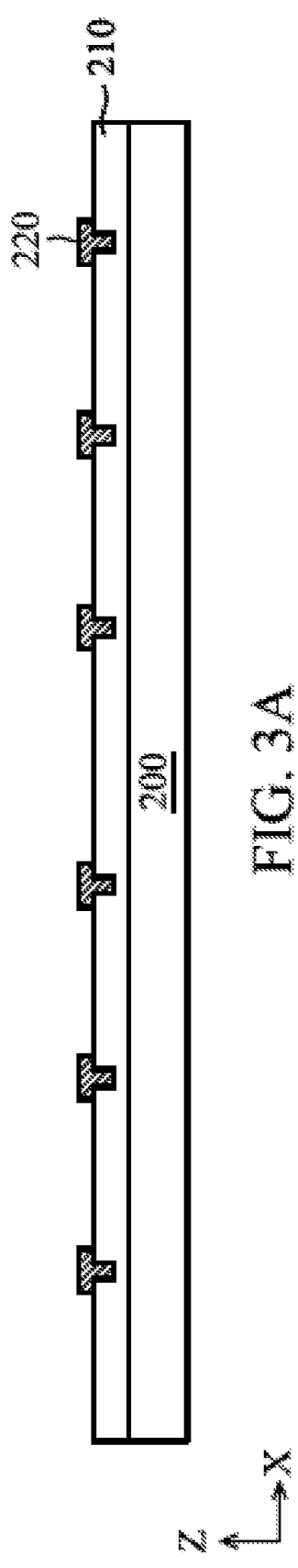
FIGS. 3A-3C illustrate cross-sectional views of different stages of a process for manufacturing the light-emitting device in accordance with some embodiments of the present disclosure.
Figure 3B:
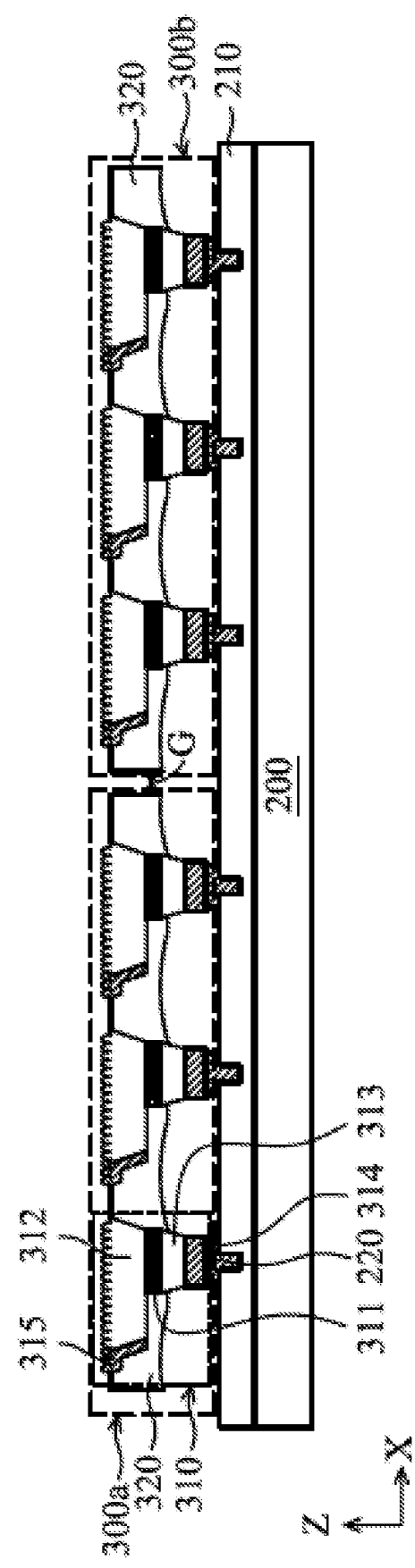
Figure 3C:
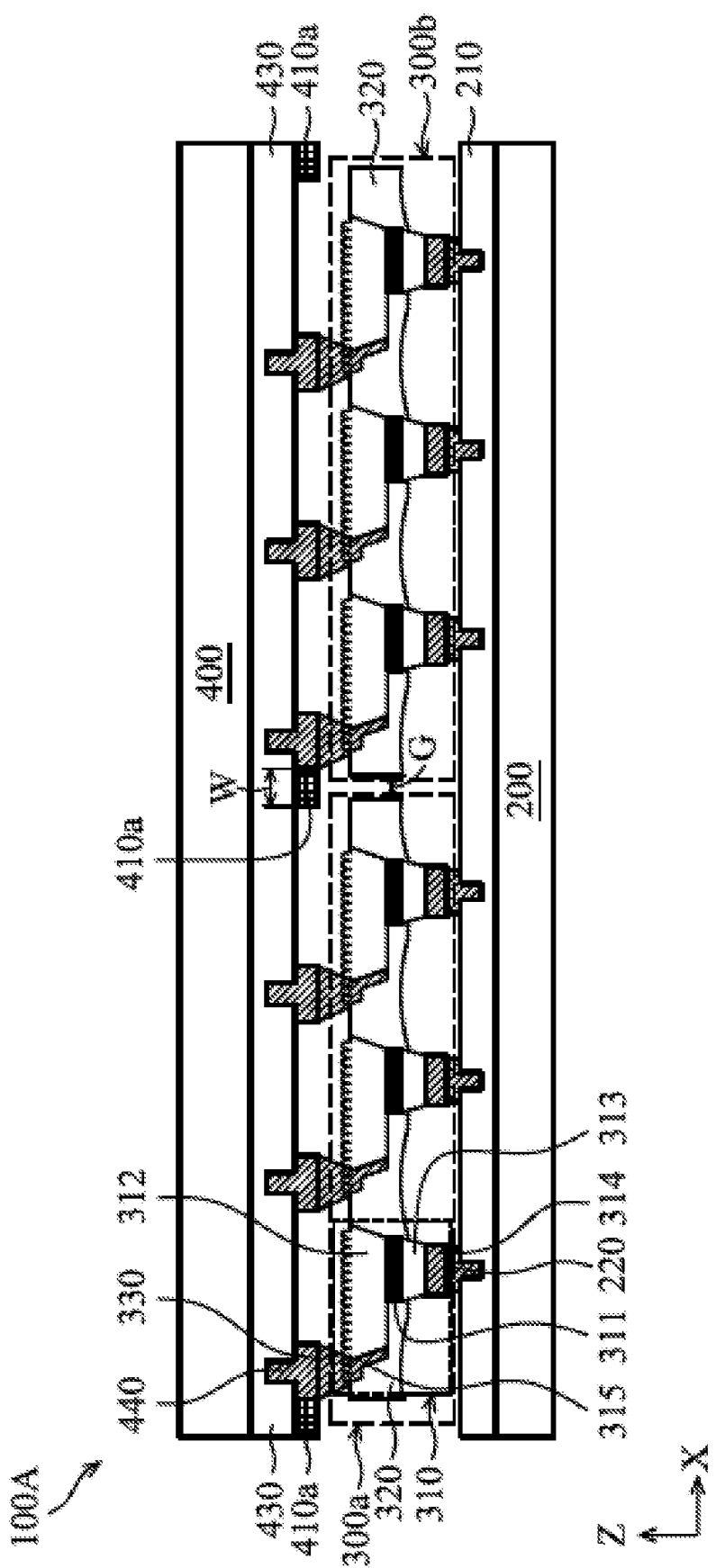

Refer to FIGS. 3A-3C, which illustrate cross-sectional views of different stages of a process for manufacturing the light-emitting device 100A in accordance with some embodiments of the present disclosure.

The process begins by providing the first substrate 200 shown in FIG. 3A. As shown in FIG. 3B, the light-emitting module 300a and the light-emitting module 300b may be transferred from a carrier substrate (not shown) to the first substrate 200. The light-emitting module 300a and the light-emitting module 300b may be disposed on (or attached to) the first substrate 200 in the same step or different steps.

As shown in FIG. 3C, the second substrate 400 may be disposed on the first substrate 200, and the light-emitting modules (such as 300a and/or 300b), and the auxiliary electrodes 330 may be disposed between the first substrate 200 and the second substrate 400.

Figure 4:
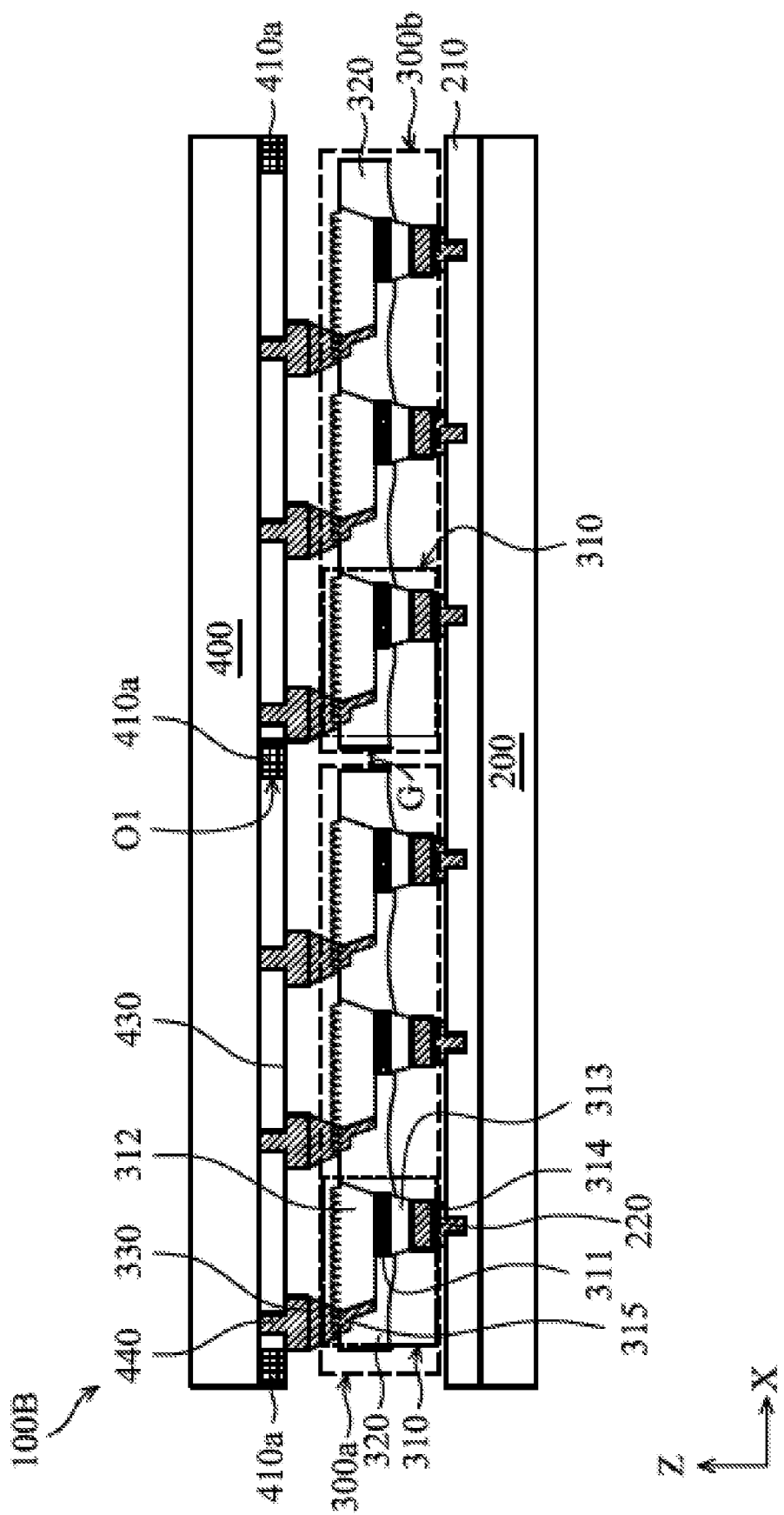
FIG. 4 illustrates a cross-sectional view of a light-emitting device in accordance with some embodiments of the present disclosure.

Refer to FIG. 4, which illustrates a cross-sectional view of a light-emitting device 100B in accordance with some embodiments of the present disclosure. In some embodiments, one of the differences between the light-emitting device 100A and the light-emitting device 100B is that the light-shielding structure 410a may be disposed in (or embedded in) the second circuit layer 430 of the light-emitting device 100B. In some embodiments, the second circuit layer 430 may form a plurality of openings O1, and the light-shielding structure 410a may be disposed in the openings O1 of the second circuit layer 430.

Figure 5:
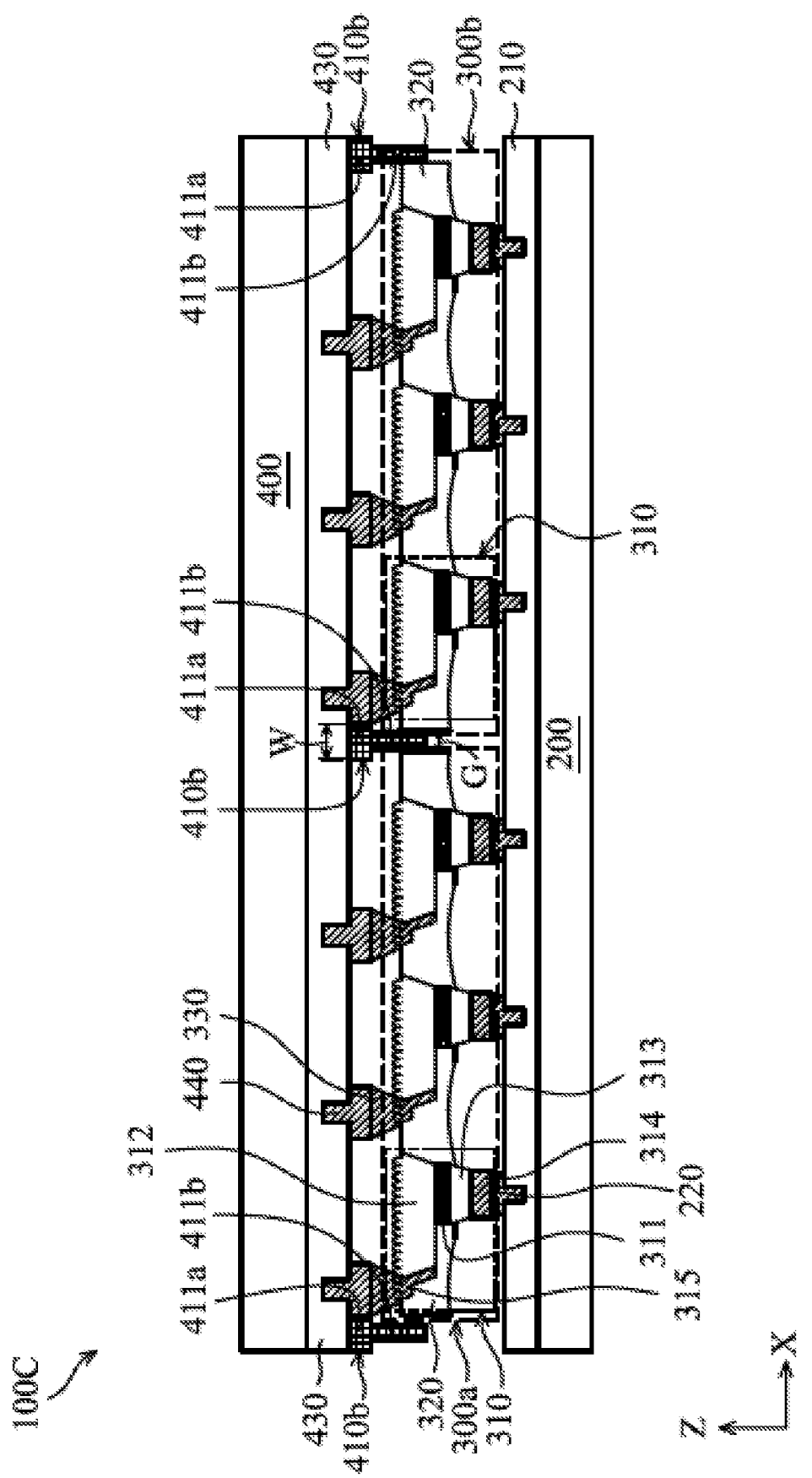
FIG. 5 illustrates a cross-sectional view of a light-emitting device in accordance with some embodiments of the present disclosure.

Refer to FIG. 5, which illustrates a cross-sectional view of a light-emitting device 100C in accordance with some embodiments of the present disclosure. In some embodiments, one of the differences between the light-emitting device 100A and the light-emitting device 100C is that the light-emitting device 100C may include a light-shielding structure 410b having a main portion 411a and a protruding portion 411b, and the protruding portion 411b connects with the main portion 411a. In some embodiments, the light-shielding structure 410b may be disposed between two adjacent ones of the light-emitting modules (such as the light-emitting modules 300a and 300b) in the normal direction Z. In some embodiments (FIG. 5), the protruding portion 411b of the light-shielding structure 410b may extend into at least part of the gap G. In some embodiments (FIG. 5), the protruding portion 411b of the light-shielding structure 410b may be in contact with a part of the light-emitting module 300a and/or a part of the light-emitting module 300b. For example, the protruding portion 411b may be in contact with a part of the fixing layers 320 of the light-emitting module 300a and/or a part of the fixing layers 320 of the light-emitting module 300b. In some embodiments, the material of the light-shielding structure 410b may include resins, glass pastes, black pigments, metallic particles (e.g. nickel, aluminum, molybdenum or alloys thereof), metal oxide particles (e.g. chromium oxide) metal nitride particles (e.g. chromium nitride), other material or a combination thereof, but it is not limited.

In some embodiments (not shown), the protruding portion 411b may be extended and/or in contact with the first circuit layer 210. In some embodiments (not shown), the protruding portion 411b may be disposed in (or embedded in) the first circuit layer 210. In some embodiments, the material of the light-shielding structure 410b may include conductive materials (such as metal) for electrically connecting to the elements disposed in the first circuit layer 210 (or the second circuit layer 430). In some embodiments, the material of the light-shielding structure 410b may include reflective materials (such as metal or alloys) for reducing an interference of the lights emitted from adjacent light-emitting modules.

In some embodiments, in cross-sectional view, the shape of the light-shielding structure may include rectangular, trapezoidal (such as positive trapezoid or inverted trapezoid), columnar or other irregular shape, but it is not limited.

Figure 6:
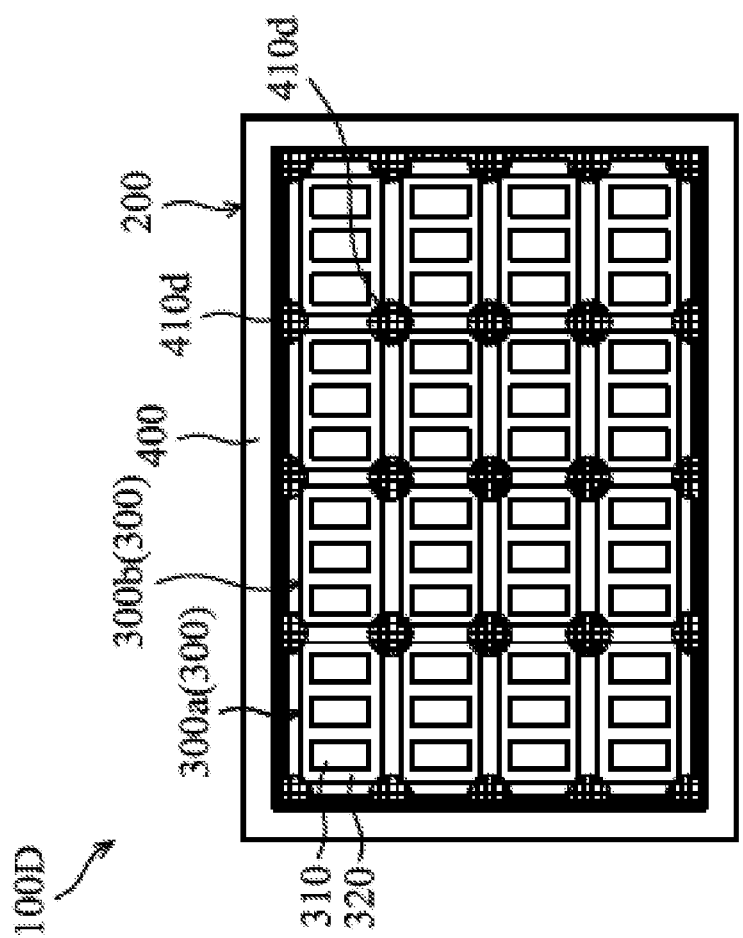
FIG. 6 illustrates a top view of a light-emitting device in accordance with some embodiments of the present disclosure.

In some embodiments, the shape (or the layout) of the light-shielding structure in the normal direction Z may be modified according to the requirements of design. For example, the light-shielding structure 410d may have a circle shape in the boundary of the light-emitting modules 300 as shown in FIG. 6. In some embodiments (FIG. 6), a plurality of light-shielding structures 410d may be separated from each other. In some embodiments, the light-shielding structure 410d may include a line pattern, a mesh pattern, an island pattern, other pattern or a combination thereof, but it is not limited. In some embodiments, the light-shielding structure 410d is in one of mesh pattern, line pattern and island pattern.

Figure 7:
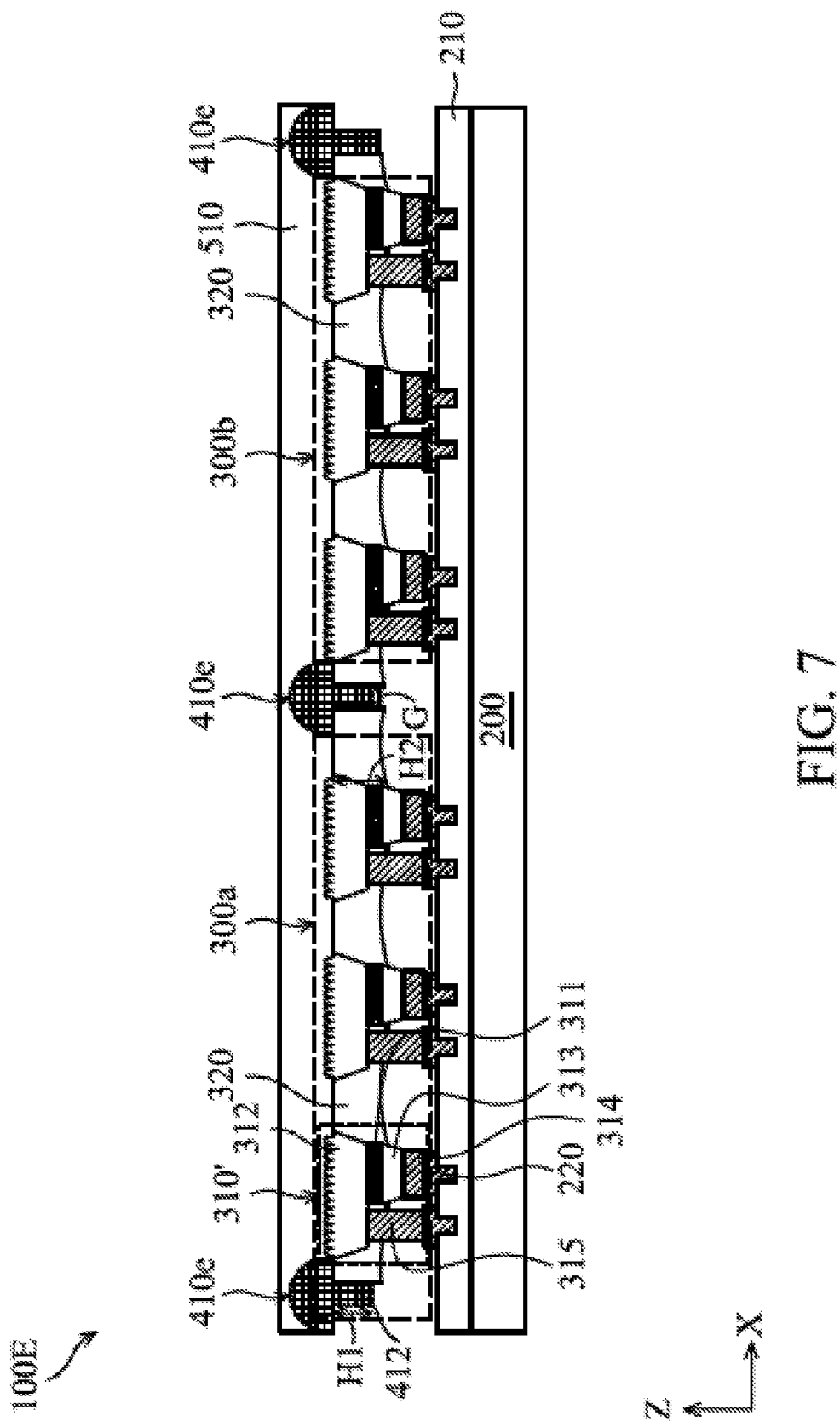
FIG. 7 illustrates a cross-sectional view of a light-emitting device in accordance with some embodiments of the present disclosure.

Refer to FIG. 7, which illustrates a cross-sectional view of a light-emitting device 100E in accordance with some embodiments of the present disclosure. One of the differences between the light-emitting device 100A and the light-emitting device 100E is that the light-emitting device 100E may include a light-shielding structure 410e and the light-emitting units 310', and the electrodes 314 of the light-emitting units 310' and the electrodes 315 of the light-emitting units 310' may be electrically connected with the first circuit layer 210 through the pads 220. In some embodiments (FIG. 7), after the light-emitting modules 300 are disposed on the first substrate 200, the light-shielding material may be disposed on the light-emitting modules 300 to form the light-shielding structure 410e. In some embodiments, the light-shielding material may be disposed on the light-emitting modules 300 by coating method or other methods. A protruding portion 412 of the light-shielding structure 410e may be defined by a portion of light-shielding structure 410e disposed between the fixing layers 320 of two adjacent ones of the light-emitting modules 300. After the light-shielding structures 410e are disposed, a protective layer 510 may be disposed on the first substrate 200 to cover the light-emitting module 300a, light-emitting module 300b and/or the light-shielding structure 410e. In some embodiments, an area of the protective layer 510 may be the same as or different from an area of the first substrate 200 in the normal direction Z. In some embodiments, the material of the protective layer 510 may include organic materials or inorganic materials, such as silicon nitride, silicon oxide, Al2O3 or resin, but it is not limited. The protective layer 510 may be a single layer or multilayer.

In some embodiments (FIG. 7), the light-shielding structure 410e may cover (or overlap with) a portion of the fixing layers 320 in the normal direction Z. In some embodiments, a height H1 of the protruding portion 412 may be modified. In some embodiments (not shown), the height H1 of the protruding portion 412 may be greater than or equal to the height H2 of the fixing layer 320. In some embodiments, the height H1 of the protruding portion 412 may be less than the height H2 of the fixing layer 320. The height H1 may be defined by a maximum height of the protruding portion 412 in the normal direction Z. The height H2 may be defined by a maximum height of the fixing layer 320 in the normal direction Z. The height H1 and/or height H2 may be measured from a scanning electron microscope (SEM) image along any direction perpendicular with the normal direction Z. In some embodiments (not shown), the height H2 of the fixing layer 320 may be adjusted according to demand. In some embodiments (not shown), the fixing layer 320 may cover the light-emitting unit 310, and the fixing layer 320 may exposure part of the electrodes 314 and part the electrodes 315 for electrically connecting to the pads 220.

Figure 8:
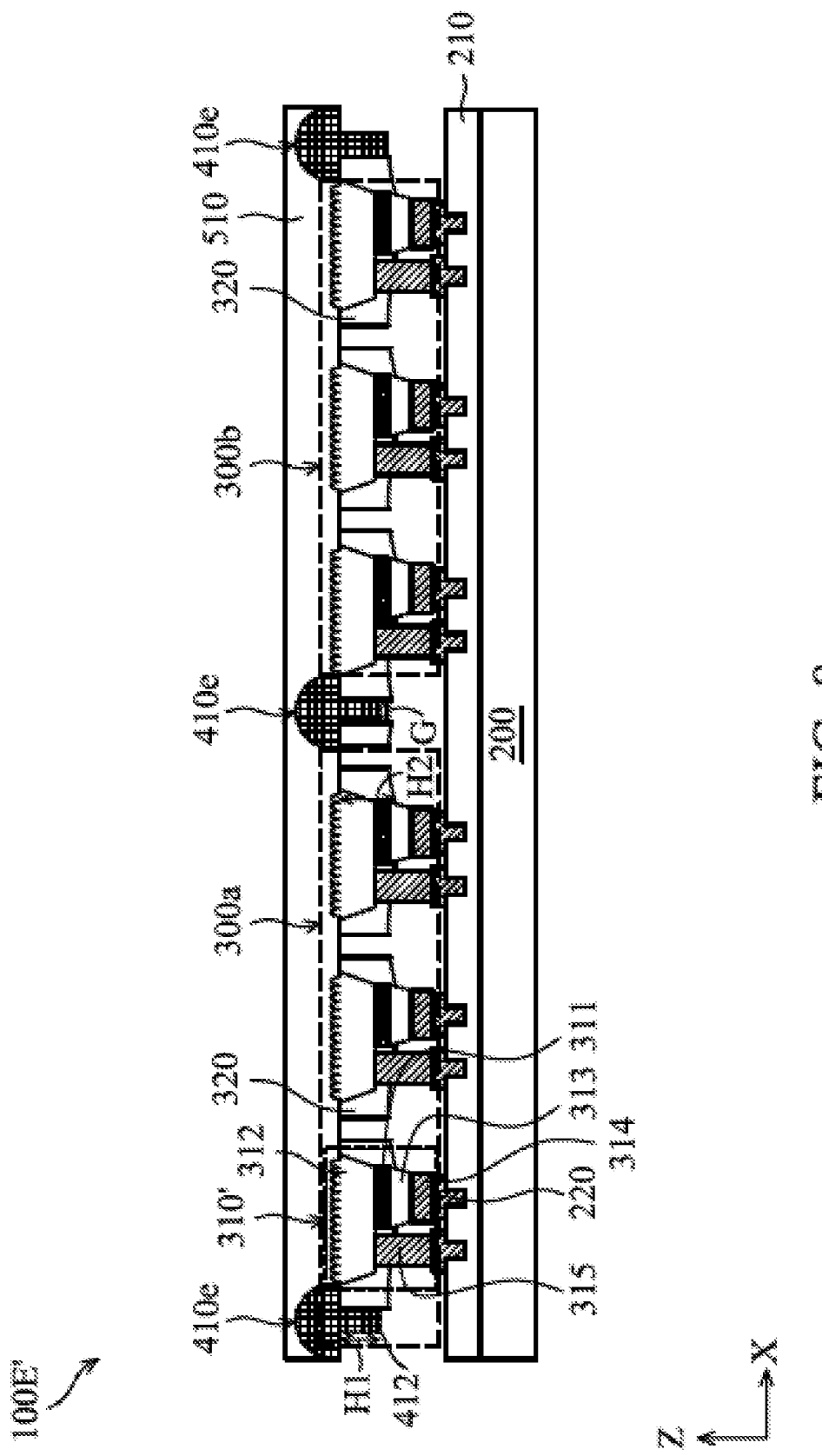
FIG. 8 illustrates a cross-sectional view of a light-emitting device in accordance with some embodiments of the present disclosure.
Figure 9:
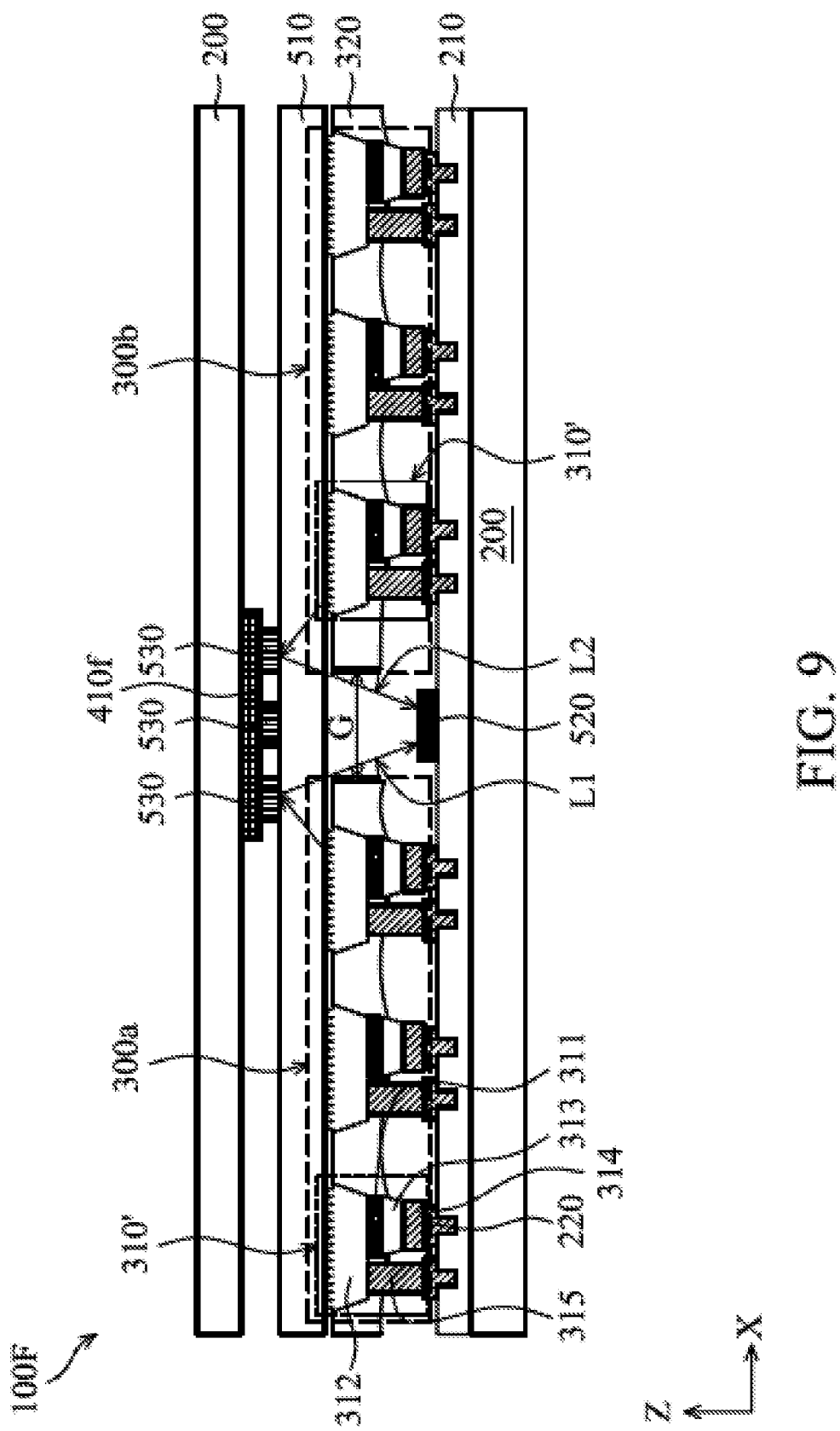
FIG. 9 illustrates a cross-sectional view of a light-emitting device in accordance with some embodiments of the present disclosure.

Refer to FIG. 8 which illustrates a cross-sectional view of a light-emitting device 100E' in accordance with some embodiments of the present disclosure. One of the differences between the light-emitting device 100E and the light-emitting device 100E' is that, the fixing layers 320 of the light-emitting module 300a (or light-emitting module 300b) of the light-emitting device 100E' may have openings disposed between the light-emitting units 310', and the openings may not overlap with the light-emitting unit 310'. The material of the fixing layers 320 of the light-emitting device 100E' may include silicon, but it is not limited. In some embodiments (FIG. 7), the material of the fixing layers 320 of the light-emitting device 100E may include sapphire, glass, PI, but it is not limited As shown in FIG. 9, the electrodes, such as the electrodes 314 and 315, of the light-emitting unit 310' may be electrically connected to the pads 220 disposed on the first substrate 200. Therefore, the second circuit layer 430 and/or the second substrate 400 may be removed in this embodiment.

Refer to FIG. 9, which illustrates a cross-sectional view of a light-emitting device 100F in accordance with some embodiments of the present disclosure. In some embodiments, one of the differences between the light-emitting device 100A and the light-emitting device 100F is that the light-emitting device 100F may further include an optical sensor 520 and reflective layers 530. In some embodiments (FIG. 9), the optical sensor 520 may be disposed between the first light-emitting module 300a and the second light-emitting module 300b, or the optical sensor 520 may at least partially overlap with (or cover) the gap G in the normal direction Z. In some embodiments (FIG. 9), the optical sensor 520 may overlap with the light-shielding structure 410f in the normal direction Z. The optical sensor 520 may be disposed to sense the light emitted from the light-emitting units 310'. For example, when the light-emitting unit 310 of the light-emitting module 300a emits a light L1, the light L1 may be incident to the reflective layer 530 and then be reflected to the optical sensor 520. Similarly, the light-emitting unit 310 of the light-emitting module 300b emits a light L2, the light L2 may be incident to the reflective layer 530 and then be reflected to the optical sensor 520. The optical sensor 520 may collects light L1 and/or the light L2, and the operating condition of the light-emitting unit 310 of the light-emitting module 300a and/or the light-emitting module 300b may be modified according to an intensity of light L1 and/or an intensity of L2 collected by the optical sensor 520, but it is not limited. Therefore, the differences between the light-emitting modules 300 (such as the light-emitting modules 300a and 300b) may be reduced or the uniformity of brightness may be increased.

In some embodiments, the optical sensor 520 may include a P-intrinsic-N diode (PIN diode) or a thin film transistor (TFT). In some embodiments, the optical sensor 520 may include GaN, GaAs, InAs, AlGaAs, GaInN or another suitable material. In some embodiments, the material of the reflective layer 530 may include metal, such as Al, Cu, Ag, Au or another suitable reflective material.

In some embodiments, the optical sensor 520 may be overlapped with the light-shielding structure 410f to reduce a possibility of the optical sensor 520 affected by surrounding light, or to increase the accuracy of the optical sensor 520. In some embodiments (FIG. 9), the reflective layers 530 may be overlapped with the light-shielding structure 410f. In some embodiments (FIG. 9), the reflective layers 530 may be disposed between the light-shielding structure 410f and the optical sensor 520 in the Z direction.

Figure 10:
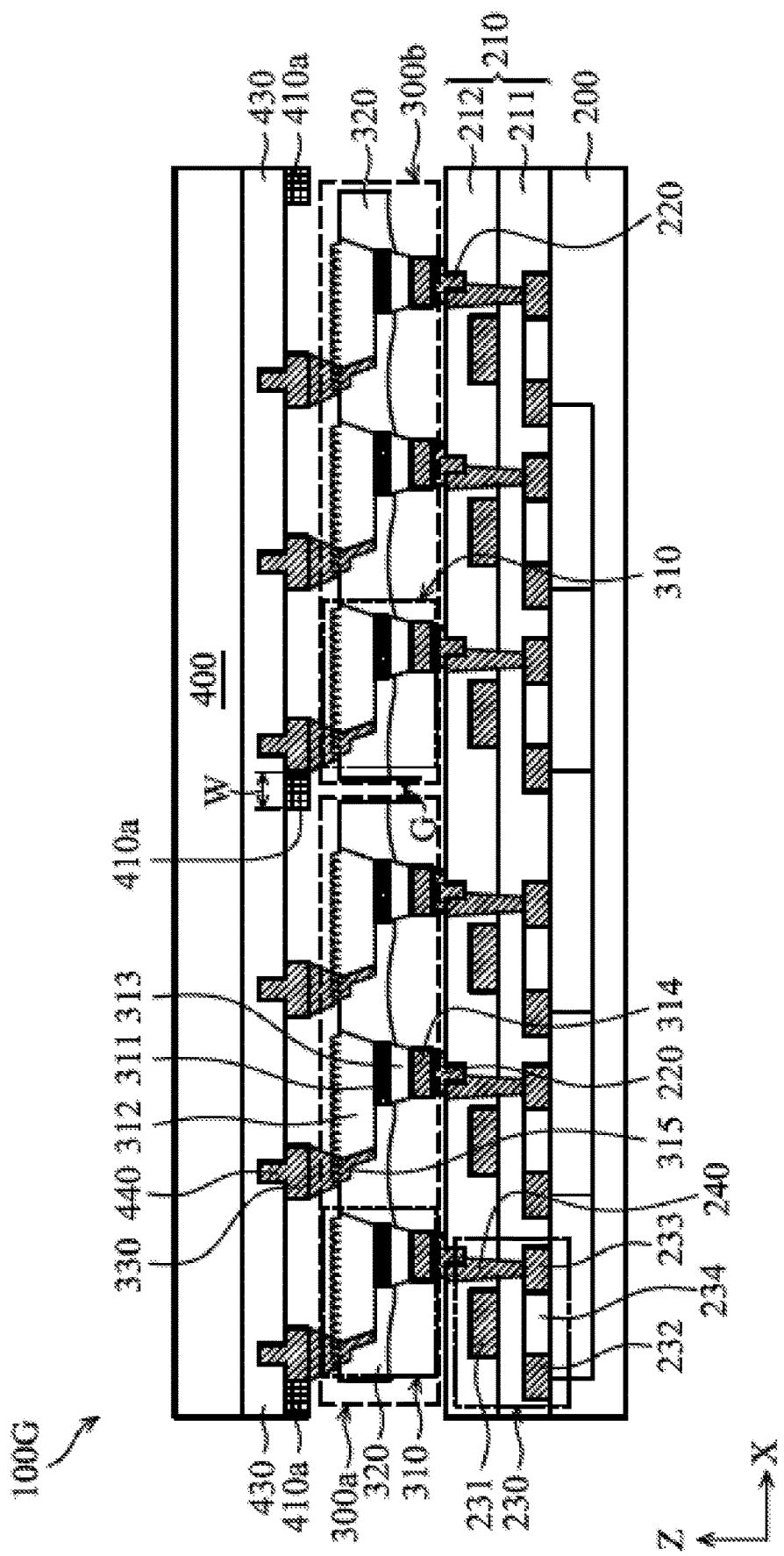
FIG. 10 illustrates a cross-sectional view of a light-emitting device in accordance with some embodiments of the present disclosure.

Refer to FIG. 10, which illustrates a cross-sectional view of a light-emitting device 100G in accordance with some embodiments of the present disclosure. In some embodiments, the light-emitting device 100G may include a plurality of driving units 230. One of the driving units 230 may be electrically connected to one of the light-emitting units 310.

In some embodiment, the driving units 230 may include a TFT. For example, the driving unit 230 may include a gate electrode 231, a source electrode 232, a drain electrode 233 and a channel region 234. The gate electrode 231 may be disposed in a first circuit layer 210; the source electrode 232, the drain electrode 233 and the channel region 234 may be disposed in a circuit layer 211. The dielectric layers 211 and 212 may be a portion of the first circuit layer 210. The material of the gate electrode 231 may include metal, such as copper (Cu), aluminum (Al), molybdenum (Mo), tungsten (W), gold (Au), chromium (Cr), nickel (Ni), platinum (Pt), titanium (Ti), other suitable materials or combinations thereof, but it is not limited. In some examples, the source electrode 232, the drain electrode 233 and/or the channel region 234 may be a portion of a semiconductor layer, the source electrode 232 and the drain electrode 233 may be doped, and the channel region 234 may not be doped, but it is not limited. In some embodiment, the channel region 234 may be overlapping with the gate electrode 231. In some embodiment, the driving units 230 may include amorphous silicon, polysilicon such as low-temp polysilicon (LTPS), metal oxide or another suitable material. The metal oxide may include indium gallium zinc oxide (IGZO), indium zinc oxide (IZO), indium gallium zinc tin oxide (IGZTO), low temperature polycrystalline silicon and oxide semiconductor (LTPO), other suitable materials or a combination thereof, but it is not limited.

As shown in FIG. 10, the light-emitting unit 310 may be electrically connected to the driving unit 230 through a conductive through hole 240. In addition, the light-emitting unit 310 of the light-emitting modules 300a and the light-emitting units 310 of the light-emitting module 300b may be electrically connected through the second circuit layer 430, but it is not limited. Moreover, the light-emitting units 310 may be individually controlled through the corresponding driving unit 230.

Figure 11:
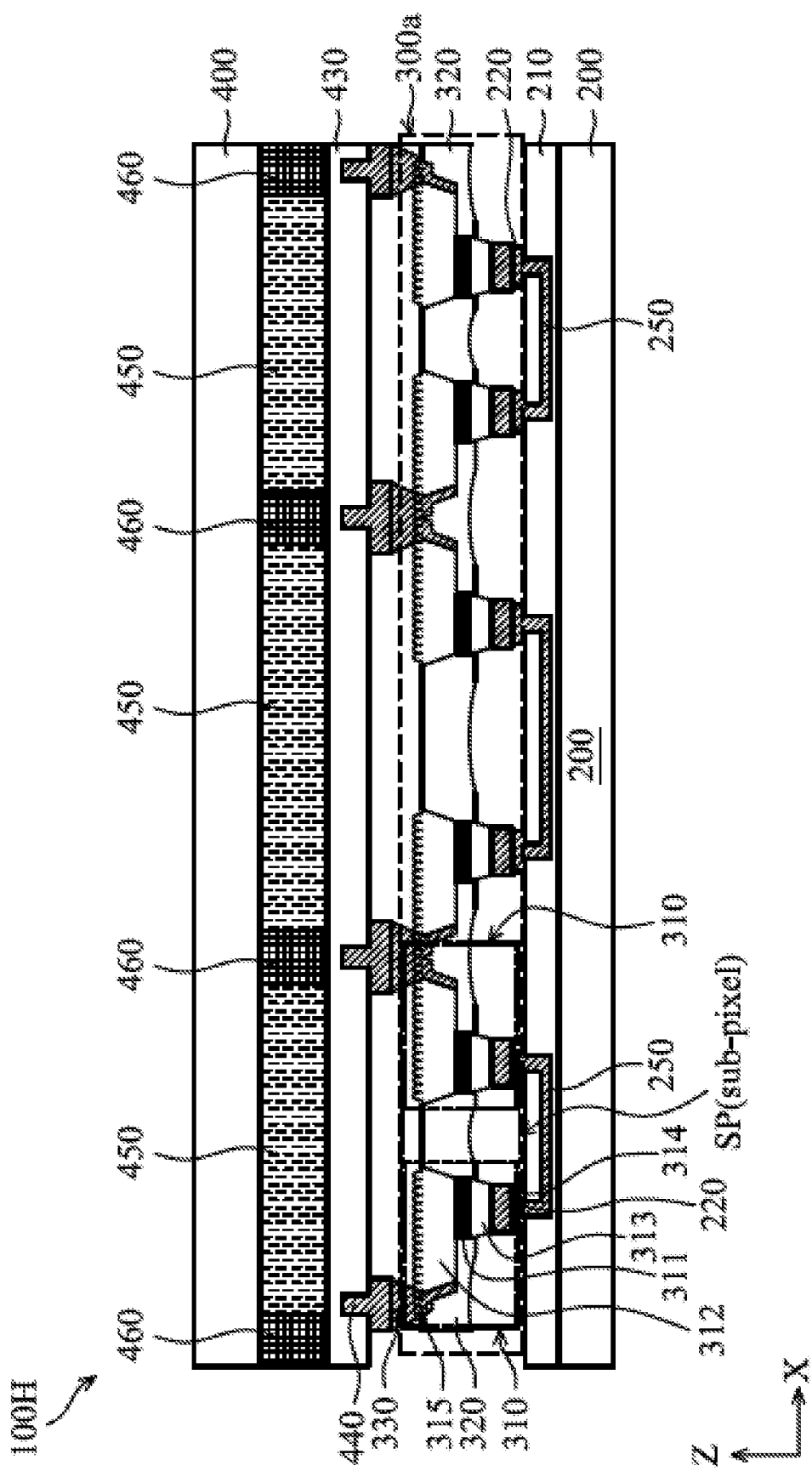
FIG. 11 illustrates a cross-sectional view of a light-emitting device in accordance with some embodiments of the present disclosure.

Refer to FIG. 11, which illustrates a cross-sectional view of a light-emitting device 100H in accordance with some embodiments of the present disclosure. In some embodiments, the light-emitting device 100H may include a light-adjusting unit 450. In some embodiments, the light-adjusting unit 450 may be disposed between the second substrate 400 and the second circuit layer 430, but it is not limited. In some embodiments, the light-adjusting unit 450 may be disposed adjacent to the light-shielding structure 460. In some embodiments (not shown), in the normal direction Z, the light-shielding structures 460 may be interlaced to each other to form a grid shape, the grid shape encloses some openings, and the light-adjusting units 450 may be disposed corresponding to the openings. The material of the light-adjusting unit 450 may include quantum dot, fluorescent material, color filter material, phosphorescent material, another suitable materials or a combination thereof, but not limited. For example, the light-adjusting unit 450 may be an organic layer or an inorganic layer blended with a quantum dot. The quantum dot may include zinc, cadmium, selenium, sulfur, InP, GaSb, GaAs, CdSe, CdS, ZnS, $(CH_3NH_3)EuI_3$, $KEuI_3$, $CsEuI_3$, or $RbEuI_3$ or a combination thereof, but it is not limited. In some embodiments (not shown), the shape of the light-adjusting units 450 may include strip shape, for example, at least one of the light-adjusting units 450 may be corresponding to (or overlap with) a plurality of the light-emitting units 310 in the normal direction Z.

In some embodiments (refer to FIG. 11), two adjacent ones of the light-emitting units 310 may be electrically connected through a wire 250. In some embodiments (refer to FIG. 11), the wire 250 may be disposed in the first circuit layer 210 (or the second circuit layer 430). In some embodiments, two adjacent ones of the light-emitting units 310 may be electrically connected through the auxiliary electrode 330, and the auxiliary electrode 330 may be electrically connected with a common electrode (not shown). In some embodiments, one of the light-adjusting units 450 may be corresponding to (or overlap with) one sub-pixel SP. In some embodiments, one of the sub-pixels SP may include at least one light-emitting unit 310. For example (FIG. 11), one of the sub-pixels SP may include two light-emitting units 310, but it is not limited. It should be noted that FIG. 11 only shows the light-emitting module 300a, the light-emitting module 300b may be similar to the light-emitting module 300a, and there is a gap G between the light-emitting module 300a and the light-emitting module 300b.

Figure 12:
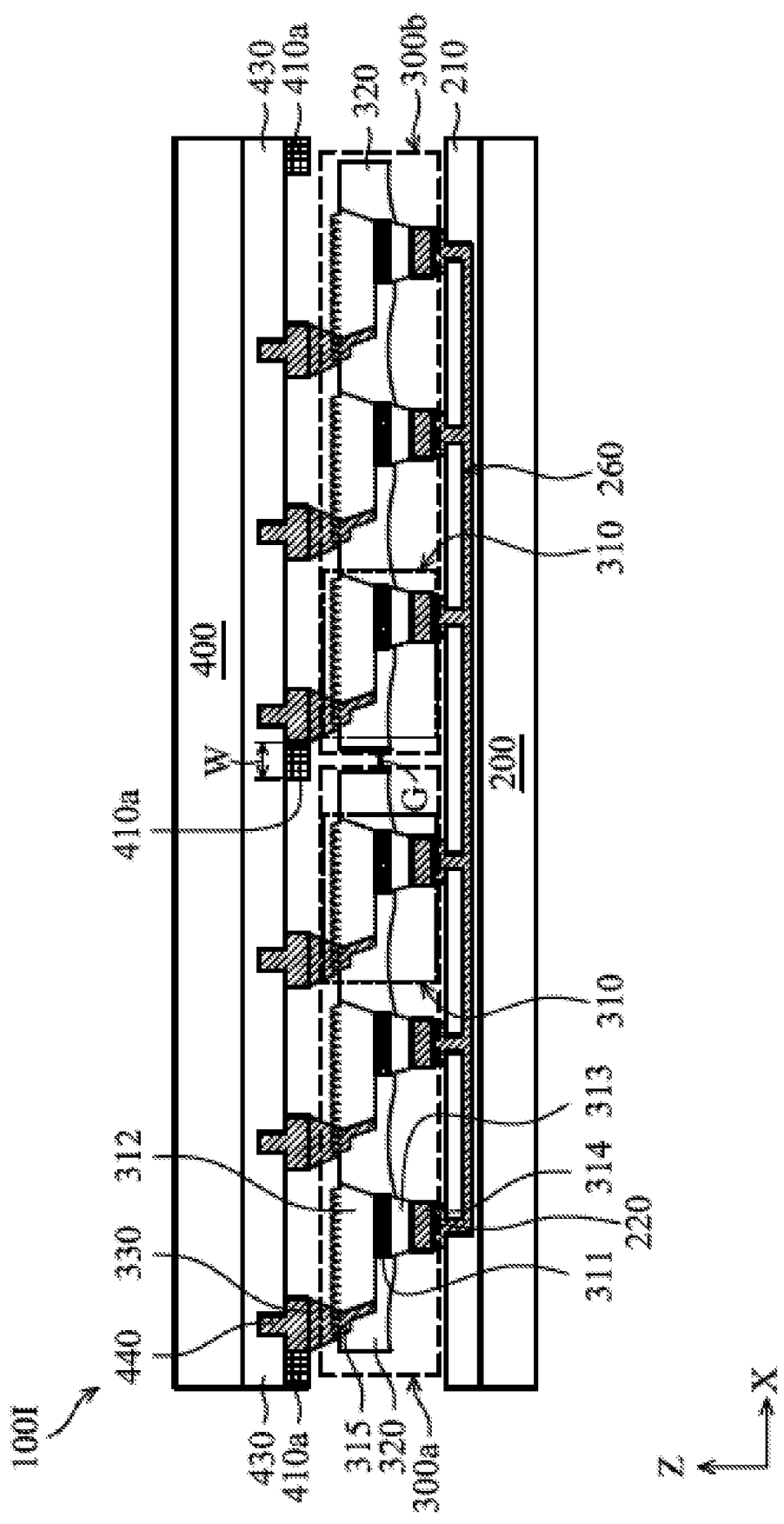
FIG. 12 illustrates a cross-sectional view of a light-emitting device in accordance with some embodiments of the present disclosure.

Refer to FIG. 12, which illustrates a cross-sectional view of a light-emitting device 100I in accordance with some embodiments of the present disclosure. In some embodiments, the light-emitting unit 310 of the light-emitting module 300a and the light-emitting unit 310 of the light-emitting module 300b may be electrically connected through a wire 260. In some embodiments (FIG. 12), the wire 260 may be disposed in the first circuit layer 210. In some embodiments (not shown), the wire 260 may be disposed in the second circuit layer 430.

Figure 13:
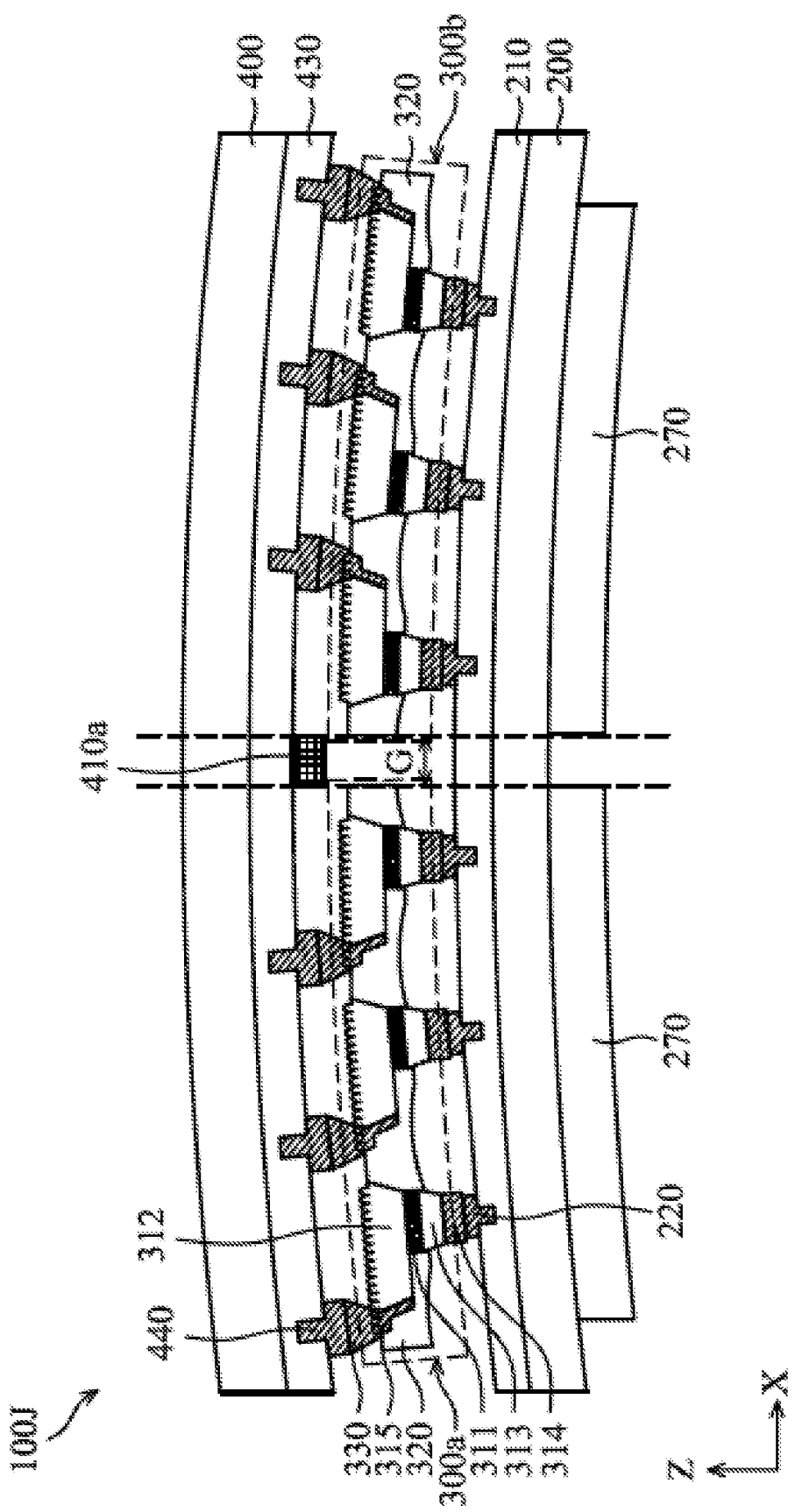
FIG. 13 illustrates a cross-sectional view of a light-emitting device in accordance with some embodiments of the present disclosure.

Refer to FIG. 13, which illustrates a cross-sectional view of a light-emitting device 100J in accordance with some embodiments of the present disclosure. In some embodiments, the first substrate 200 and/or the second substrate 400 of the light-emitting device 100J may include flexible substrates. In some embodiments, the ratio of Young's modulus between the fixing layer 320 and the first substrate 200 may be in a range between 0.8 to 1.2 (0.8≤ratio≤1.2), but it is not limited. In some embodiments, the ratio of Young's modulus between the second substrate 400 and the first substrate 200 may be in a range between 0.8 to 1.2 (0.8≤ratio≤1.2), but it is not limited.

In addition, the light-emitting device 100J may further include a supporting film 270. The first substrate 200 may be disposed between the supporting film 270 and the second substrate 400. In some embodiments, the supporting film 270 may overlap with the light-emitting module 300a and/or the light-emitting module 300b in the normal direction Z. In some embodiments (FIG. 13), the supporting film 270 does not overlap with the gap G in the normal direction Z. The material of the supporting film 270 may include glass, polymer, plastic or another material, but it is not limited.

Figure 14:
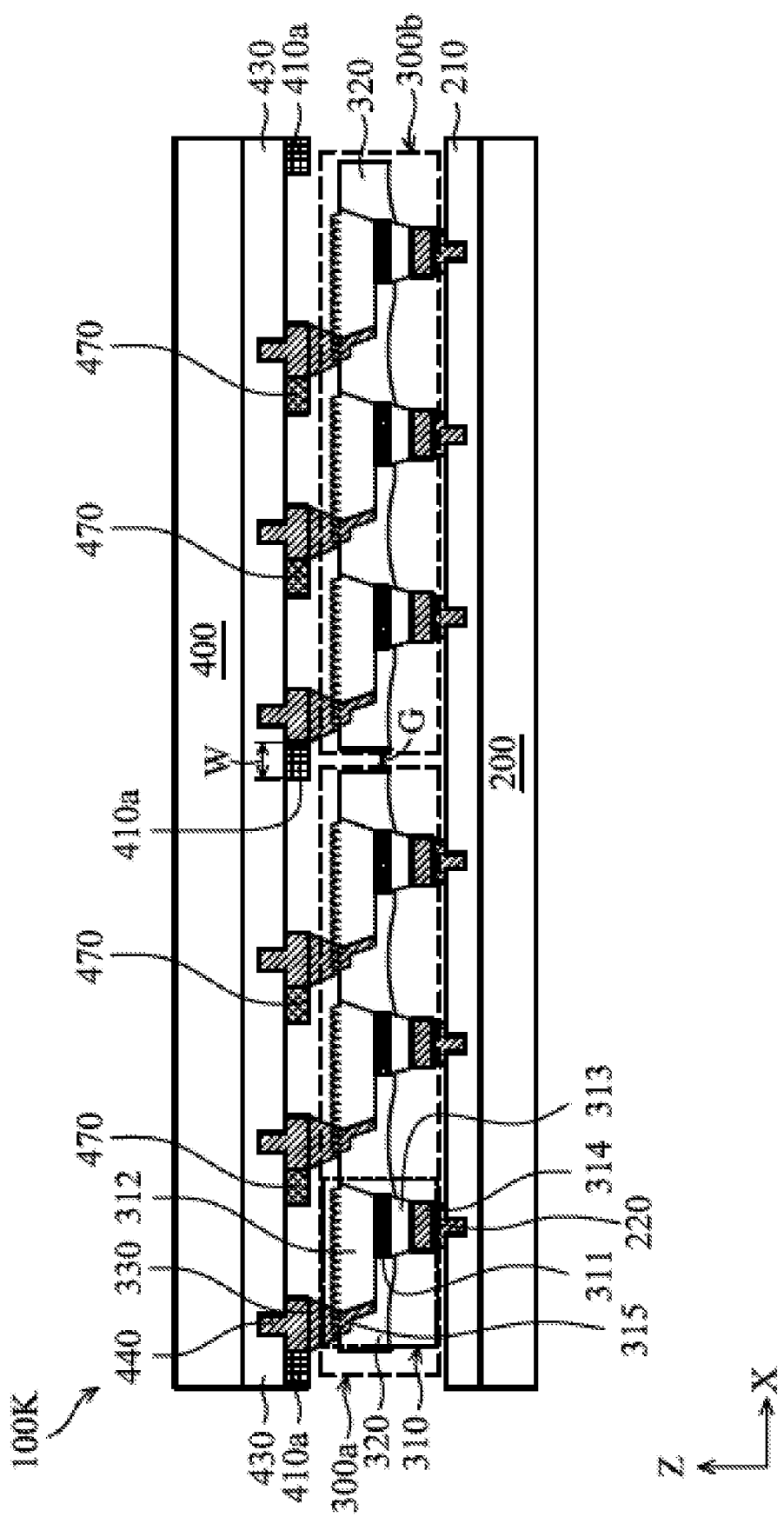
FIG. 14 illustrates a cross-sectional view of a light-emitting device in accordance with some embodiments of the present disclosure.

Refer to FIG. 14, which illustrates a cross-sectional view of a light-emitting device 100K in accordance with some embodiments of the present disclosure. In some embodiments, one of the differences between the light-emitting device 100A and the light-emitting device 100K is that the light-emitting device 100K further includes light-shielding structures 470. The light-shielding structure 470 may be disposed between two adjacent ones of the light-emitting units 310. In some embodiments, the light-shielding structure 470 may be disposed between two adjacent ones of the sub-pixels. The light-shielding structures 470 may be disposed for reducing the interference of the light of adjacent light-adjusting unit 450 or the light emitted from the surrounding.

In some disclosures, the light-shielding structures (such as 410a, 410b, 410c, 410d, 410e and 410f) disposed corresponding to (or overlapping to) the gap G in the normal direction Z may be referred as the first portion of the light-shielding structure, the light-shielding structures (such as 460 and 470) disposed between two adjacent ones of the light-adjusting units 450 (refer to FIG. 11) or two adjacent ones of the light-emitting units 310 (such as sub-pixels) in the normal direction Z may be referred as the second portion of the light-shielding structures. In some disclosures (not shown), the gap G may be filled with the air or other suitable materials (such as adhesive materials, buffer materials or other filling component, but it is not limited).

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a light-emitting device, comprising:
providing a first substrate;
transferring a first light-emitting module with a plurality of first light-emitting units and a second light-emitting module with a plurality of second light-emitting units to the first substrate; and
providing a light-shielding structure on the first substrate;
wherein the first light-emitting module comprises a first fixing layer disposed between the plurality of first light-emitting units, and the plurality of first light-emitting units are connected with each other through the first fixing layer,
wherein the second light-emitting module comprises a second fixing layer disposed between the plurality of second light-emitting units, and the plurality of second light-emitting units are connected with each other through the second fixing layer,
wherein the first fixing layer and the second fixing layer are separated from each other,
wherein there is a gap between the first light-emitting module and the second light-emitting module, and the light-shielding structure is overlapped with the gap.

2. The method according to claim 1, wherein the light-shielding structure has a mesh pattern, a line pattern or an island pattern.

3. The method according to claim 1, wherein a portion of the light-shielding structure is disposed between the first light-emitting module and the second light-emitting module.

4. The method according to claim 1, wherein a width of the light-shielding structure is greater than or equal to a width of the gap.

5. The method according to claim 1, further comprising providing a second substrate on the first light-emitting module and the second light-emitting module.

6. The method according to claim 5, wherein the light-shielding structure is disposed between the second substrate and the first substrate.

* * * * *